(12) United States Patent
Morton et al.

(10) Patent No.: US 11,436,036 B2
(45) Date of Patent: Sep. 6, 2022

(54) SYSTEMS AND METHODS TO DECREASE THE SIZE OF A COMPOUND VIRTUAL APPLIANCE FILE

(71) Applicant: EMC IP Holding Company LLC, Hopkinton, MA (US)

(72) Inventors: James Morton, Adamstown, MD (US); Ming Zhang, Shanghai (CN); Lihui Su, Shanghai (CN); Min Liu, Shanghai (CN); Yujun Liang, Shanghai (CN); Scott Quesnelle, Burlington (CA)

(73) Assignee: EMC IP Holding Company LLC, Hopkinton, MA (US)

( * ) Notice: Subject to any disclaimer, the term of this patent is extended or adjusted under 35 U.S.C. 154(b) by 262 days.

(21) Appl. No.: 16/909,740

(22) Filed: Jun. 23, 2020

(65) Prior Publication Data

US 2021/0397468 A1 Dec. 23, 2021

(51) Int. Cl.
*G06F 9/455* (2018.01)
(52) U.S. Cl.
CPC .. *G06F 9/45558* (2013.01); *G06F 2009/4557* (2013.01); *G06F 2009/45583* (2013.01)
(58) Field of Classification Search
CPC ......... G06F 9/45558; G06F 2009/4557; G06F 2009/45583
See application file for complete search history.

(56) References Cited

U.S. PATENT DOCUMENTS

| | | | |
|---|---|---|---|
| 9,311,375 B1* | 4/2016 | Naik | G06F 16/275 |
| 2014/0095816 A1* | 4/2014 | Hsu | G06F 11/1451 711/162 |
| 2014/0188807 A1* | 7/2014 | Al-Kiswany | G06F 11/1464 707/652 |
| 2014/0229451 A1* | 8/2014 | Venkatesh | G06F 16/1752 707/692 |

OTHER PUBLICATIONS

J. Xu, W. Zhang, Z. Zhang, T. Wang, and T. Huang, "Clustering-based acceleration for virtual machine image deduplication in the cloud environment," J. Syst. Softw., vol. 121, pp. 144-156, Nov. 2016 (Year: 2016).*
U. Deshpande, B. Schlinker, E. Adler, and K. Gopalan, "Gang migration of virtual machines using cluster-wide deduplication," in CCGrid, 2013 (Year: 2013).*

\* cited by examiner

*Primary Examiner* — Jacob D Dascomb
(74) *Attorney, Agent, or Firm* — Staniford Tomita LLP

(57) ABSTRACT

An application is provided as a compound virtual appliance having components to be hosted by virtual machines. Each component includes a set of virtual machine disks. Partial versions of the components are created by removing from each component each virtual machine disk determined to be a duplicate of a virtual machine disk of another component. A compact version of the compound virtual appliance is created by packing together the partial versions of the components and a single copy of each virtual machine disk having been determined to be a duplicate. The compact compound virtual appliance is deployed to a customer site.

(Continued)

At the customer site, a complete version of the compound virtual appliance is reconstructed by adding back the single copy of each virtual machine disk having been determined to be a duplicate into each component having had the duplicate virtual machine disk removed.

18 Claims, 16 Drawing Sheets

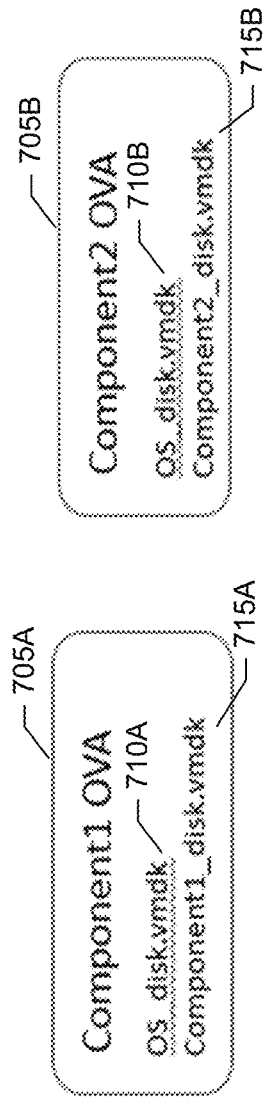
FIG. 7
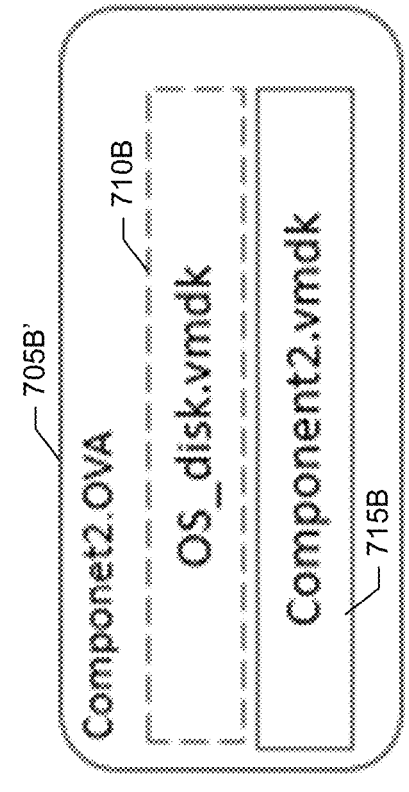
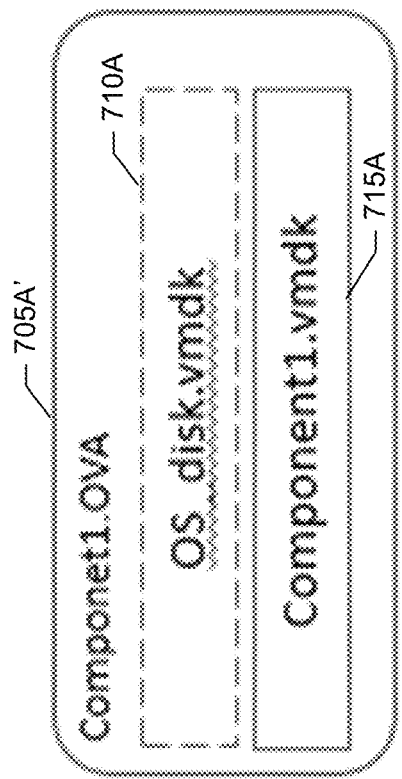
FIG. 8

```
{
    "Master": {                                          ← 1205
        "startup_script": "/Master/init/config.sh",      ← 1220
        "vcenter_ip": "10.12.12.12",
        "vcenter_username": "admin",
        "vcenter_password": "abc123",                    ← 1225
    },
    "Component1": {
        "disks": [
            OS_disk,
            Component1_disk.vmdk
        ],                                               ← 1210A
        "mount_folder": "/Component1"
    },
    "Component2": {
      "disks": [
      OS_disk,
      Component2_disk.vmdk
  ],
  "mount_folder":"/Component2"
      },
  }
```

FIG. 12

```
admin@s1-poc-jazz-1:/search/sw-repo/ovas/temp> ls -l
total 728244
-rw------- 1 admin admin 745717760 May 12 10:53 test.ova
```

FIG. 13

```
admin@s1-poc-jazz-1:/search/sw-repo/ovas/temp> ovftool test.ova test.ovf
Opening OVA source: test.ova
The manifest validates
Opening OVF target: test.ovf
Writing OVF package: test.ovf
Disk progress: 100%
Transfer Completed
Completed successfully
```

FIG. 14

```
admin@s1-poc-jazz-1:/search/sw-repo/ovas/temp> rm test.ova
admin@s1-poc-jazz-1:/search/sw-repo/ovas/temp> ls -l
total 1456496
-rw------- 1 admin admin 739513344 May 12 10:56 test-disk1.vmdk
-rw------- 1 admin admin    377344 May 12 10:56 test-disk2.vmdk
-rw------- 1 admin admin    358912 May 12 10:56 test-disk3.vmdk
-rw------- 1 admin admin   5364224 May 12 10:56 test-disk4.vmdk
-rw------- 1 admin admin       443 May 12 10:56 test.mf
-rw------- 1 admin admin     96560 May 12 10:56 test.ovf
```

FIG. 15

```
admin@s1-poc-jazz-1:/search/sw-repo/ovas/temp> rm test-disk1.vmdk
```

FIG. 16

```
admin@s1-poc-jazz-1:/search/sw-repo/ovas/temp> cp \os-disk\disk1.vmdm test-disk1.vmdk
admin@s1-poc-jazz-1:/search/sw-repo/ovas/temp> ovftool test.ovf test.ova
Opening OVF source: test.ovf
The manifest validates
Opening OVA target: test.ova
Writing OVA package: test.ova
Transfer Completed
Completed successfully
admin@s1-poc-jazz-1:/search/sw-repo/ovas/temp> ls -l test.ova
-rw------- 1 admin admin 745715200 May 12 11:13 test.ova
```

FIG. 17

SYSTEMS AND METHODS TO DECREASE THE SIZE OF A COMPOUND VIRTUAL APPLIANCE FILE

TECHNICAL FIELD

The present invention relates generally to information processing systems, and more particularly to distributing applications.

BACKGROUND

Virtual appliances have become a popular way to distribute software products. A virtual appliance can include an application designed to run on a virtualization platform. Distributing an application as a virtual appliance helps to speed the installation process and reduce the amount of configuration required to run the application. This is because a virtual appliance generally includes the application as a complete ready to run software stack.

A size of the virtual appliance, however, can be quite large. For example, a typical virtual appliance may be many gigabytes (GBs) in size. Sending such large files across a network (e.g., Internet) can require an enormous amount of time and network resources including bandwidth and other computing resources.

There is a need for improved systems and techniques to reduce a size of a virtual appliance for transmission.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF DESCRIPTION OF THE FIGURES

In the following drawings like reference numerals designate like structural elements. Although the figures depict various examples, the one or more embodiments and implementations described herein are not limited to the examples depicted in the figures.

FIG. 7 shows a block diagram of a first step of a packaging phase, according to one or more embodiments.

FIG. 8 shows a block diagram of a second step of the packaging phase, according to one or more embodiments.

FIG. 12 shows an example of metadata that may be passed to a virtual machine manager to reconstruct a full version of a virtual appliance, according to one or more embodiments.

FIG. 13 shows a screenshot listing an OVA, according to one or more embodiments.

FIG. 14 shows a screenshot of the OVA shown in FIG. 13 being extracted into its component parts, according to one or more embodiments.

FIG. 15 shows a screenshot listing the parts in the OVA, according to one or more embodiments.

FIG. 16 shows a screenshot of a virtual machine disk being removed from the OVA, according to one or more embodiments.

FIG. 17 shows a screenshot of copying back in the virtual machine disk that was removed, according to one or more embodiments.

DETAILED DESCRIPTION

Figure 1:
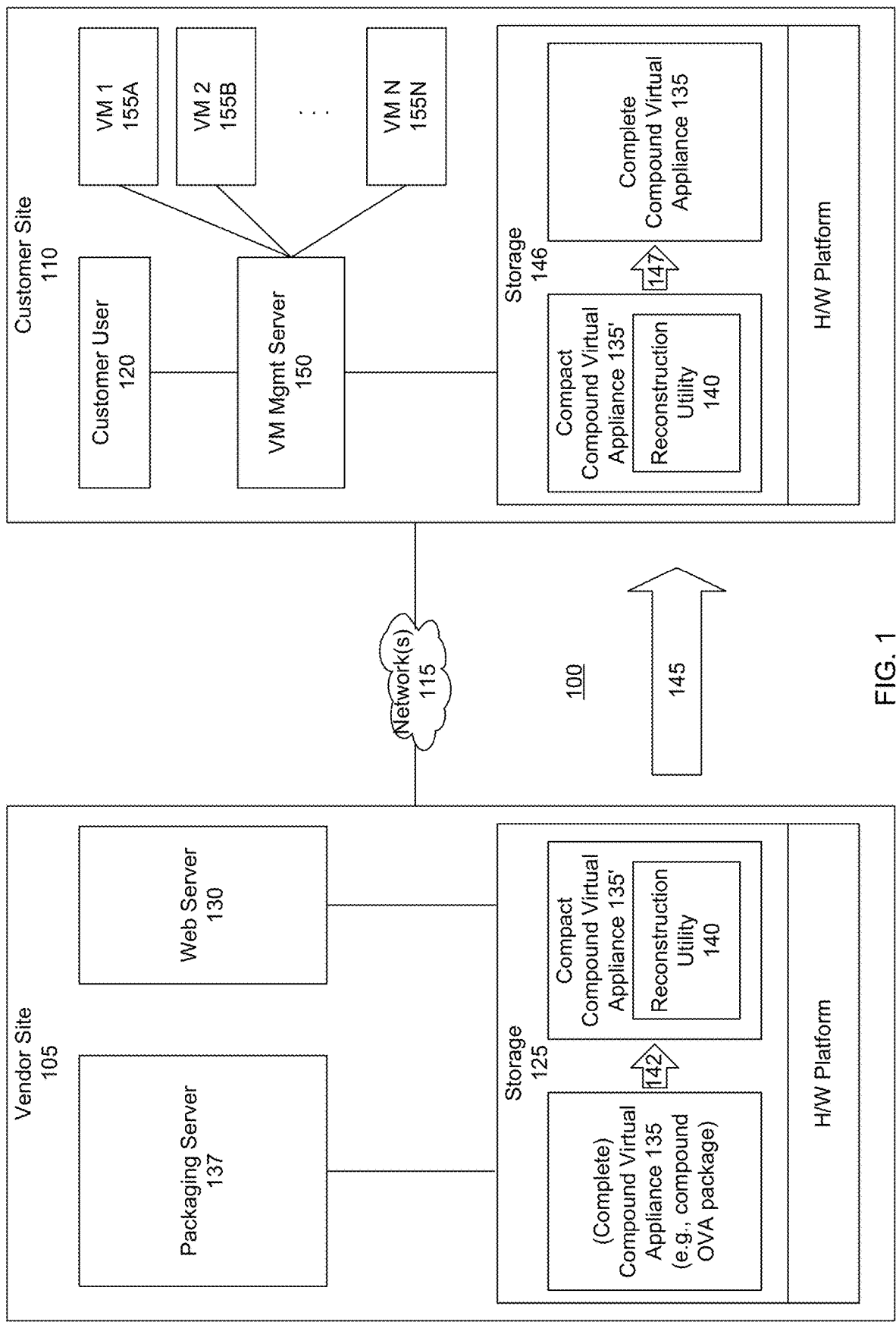
FIG. 1 shows a block diagram of an information processing system comprising a system for reducing a size of a compound virtual appliance, according to one or more embodiments.

A detailed description of one or more embodiments is provided below along with accompanying figures that illustrate the principles of the described embodiments. While aspects of the invention are described in conjunction with such embodiment(s), it should be understood that it is not limited to any one embodiment. On the contrary, the scope is limited only by the claims and the invention encompasses numerous alternatives, modifications, and equivalents. For the purpose of example, numerous specific details are set forth in the following description in order to provide a thorough understanding of the described embodiments, which may be practiced according to the claims without some or all of these specific details. For the purpose of clarity, technical material that is known in the technical fields related to the embodiments has not been described in detail so that the described embodiments are not unnecessarily obscured.

It should be appreciated that the described embodiments can be implemented in numerous ways, including as a process, an apparatus, a system, a device, a method, or a computer-readable medium such as a computer-readable storage medium containing computer-readable instructions or computer program code, or as a computer program product, comprising a computer-usable medium having a computer-readable program code embodied therein. In the context of this disclosure, a computer-usable medium or computer-readable medium may be any physical medium that can contain or store the program for use by or in connection with the instruction execution system, apparatus or device. For example, the computer-readable storage medium or computer-usable medium may be, but is not limited to, a random access memory (RAM), read-only memory (ROM), or a persistent store, such as a mass storage device, hard drives, CDROM, DVDROM, tape, erasable programmable read-only memory (EPROM or flash memory), or any magnetic, electromagnetic, optical, or electrical means or system, apparatus or device for storing information. Alternatively or additionally, the computer-readable storage medium or computer-usable medium may be any combination of these devices or even paper or another suitable medium upon which the program code is printed, as the program code can be electronically captured, via, for instance, optical scanning of the paper or other medium, then compiled, interpreted, or otherwise processed in a suitable manner, if necessary, and then stored in a computer memory. Applications, software programs or computer-readable instructions may be referred to as components or modules. Applications may be hardwired or hard coded in hardware or take the form of software executing on a general purpose computer or be hardwired or hard coded in hardware such that when the software is loaded into and/or executed by the computer, the computer becomes an apparatus for practicing the invention. Applications may also be downloaded, in whole or in part, through the use of a software development kit or toolkit that enables the creation and implementation of the described embodiments. In this specification, these implementations, or any other form that the invention may take, may be referred to as techniques. In general, the order of the steps of disclosed processes may be altered within the scope of the invention. Aspects of the one or more embodiments described herein may be implemented on one or more computers executing software instructions, and the computers may be networked in a client-server arrangement or similar distributed computer network.

Disclosed herein are methods and systems for decreasing or reducing a size of a virtual appliance file. In a specific embodiment, the virtual appliance file is a compound virtual appliance file having one or more other virtual appliance files. FIG. 1 shows a block diagram of an information processing system 100 configured in accordance with an illustrative environment. The variable N and other similar index variables herein such as M are assumed to be arbitrary positive integers greater than or equal to two. It should be appreciated that the blocks, modules, and components shown in FIG. 1 may be functional and there can be many different hardware and software configurations to implement the functions described.

In the example shown in FIG. 1, there is a vendor site 105, a customer site 110, and a network 115 connected between the customer and vendor sites. The vendor is an entity such as company, enterprise, or other organization that offers software products or services for sale or rental to a customer 120. The customer can use the network to connect to the vendor site and download applications including installation packages and updates.

The vendor site includes storage 125 and a web server 130. The web server is connected to storage 125. Storage 125 includes an application that is provided or delivered as a virtual appliance 135. The web server is responsible for processing client requests including a request by the customer for a download of the virtual appliance file. Once downloaded, the application contained within the virtual appliance file can continue to be deployed at the customer site. A web server uses the hypertext transfer protocol (HTTP) for transmitting files. It should be appreciated that the web server and HTTP protocol is merely an example. In other embodiments, files may instead or additionally be transmitted using a file transfer protocol (FTP), file transfer over transfer layer security (FTPS), or any other competent protocol (e.g., secure file transfer protocol (SFTP)).

Generally, a virtual appliance refers to a pre-configured virtual machine image, ready to run within a virtualized environment. Virtualization relies on software to simulate hardware functionality and create a virtual computer system. One type of virtual computer system is a virtual machine (VM). A virtual machine is a tightly isolated software container with an operating system and application inside. Each self-contained VM can function as an independent computer. Multiple VMs may be hosted on a single computer. This allows multiple operating systems and applications to run on just one physical server which may be referred to as a host. The host machine includes physical computing hardware such as a processor, memory, storage, and other physical resources. A thin layer of software called a hypervisor decouples the virtual machines from the host and dynamically allocates computing resources to each virtual machine as needed.

In other words, a virtual machine is a software-based computer that provides operating systems and applications with "virtual" access to hardware resources such as CPU, RAM, networking, and storage. Virtual machines offer many advantages over physical computers and can encapsulate an entire physical computer environment—including the OS, applications, and all data—inside a single file. However, users must generally still configure the virtual hardware, guest operating system, and guest application before placing a virtual machine into operation.

Virtual appliances can help reduce the installation, configuration, and maintenance costs associated with running complex stacks of software. A virtual appliance is generally not a complete virtual machine platform, but rather a software image containing a software stack designed to run on a virtual machine platform. Virtual appliances, like virtual machines, can incorporate an application, OS, and virtual hardware. Virtual appliances, however, differ from virtual machines in that they are delivered to customers as preconfigured "turnkey" solutions that simplify deployment for customers by eliminating the need for manual configuration of the virtual machines and operating systems used to run the appliance. Virtual appliances can be provided to a user or customer as files, via electronic download (e.g., over the Internet or other network) or via physical distribution (e.g., universal serial bus (USB) drive, compact disc (CD), or other physical storage medium).

A file format commonly used for virtual appliance files is the Open Virtualization Format (OVF) or Open Virtual Appliance (OVA) file format. An OVA file is a type of archive file that holds or contains other data. In particular, files for an application including virtual machine disk files (e.g., .vmdk files), OVF files, and other files associated with the application may be compressed into a single virtual appliance or OVA file. An OVA file is a virtual appliance that can be used by virtualization platforms. The OVA file is a package that contains files used to describe a virtual machine. Specifically, an OVA file may include an .OVF descriptor file, optional manifest (.MF) and certificate files, and other related files including virtual machine disk files (e.g., operating system disk image file, application disk image file, and so forth). An OVA can be considered a Tape Archive (TAR) of OVF and VMDK files. An extraction or file unzip program can be used to extract or un-compress the contents of an OVA file. An example of an unzip program, tool, or utility is 7-zip. Pack/unpack utilities such as 7-Zip may be referred to as file archivers, i.e., utilities used to place groups of files within compressed containers referred to as "archives."

Many virtualization platforms such as those provided by VMware of Palo Alto, Calif.; Microsoft of Redmond, Wash.; and others can install and run virtual appliances from an OVA or OVF file. Specific embodiments are described in conjunction with OVA and OVF formatted files. It should be appreciated, however, that the described systems and techniques can be applied to other virtual appliance file formats.

A virtual appliance file (e.g., OVA file) may include multiple other virtual appliance files. For example, an application to be deployed in a virtualized computing environment or cluster may include multiple components designed to be hosted on multiple respective virtual machines. A virtual appliance file that contains one or more other virtual appliance files may be referred to as a compound virtual appliance file. In a specific embodiment, the application is provided as a compound OVA file containing multiple sub-OVA or component OVA files.

Delivering a product installation (or update) package as an OVA is a popular way to deploy a product in a virtualized environment including a VMWare environment or other cloud computing or virtualized environment. Cloud computing is the delivery of computing services—including servers, storage, databases, networking, software, analytics, and intelligence—over the Internet.

When a product contains multiple sub-components, where each sub-component may also be delivered as an OVA, then that product's OVA will include multiple OVAs. The master product OVA may be referred to as a compound OVA.

In many cases, the size of the compound OVA package will be very large. For example, depending upon the complexity of the application, number of components in the application, and other factors, the size of a compound OVA file may be 5, 10, 20, 30, or more than 30 gigabytes (GB). The large package size can cause issues when a customer attempts to download the package from a web site of a vendor or other provider of the application. Large files can require a significant amount of network bandwidth and time to download. Even brief disruptions in connectivity can cause the entire downloading process to be restarted. There is a need for improved systems and techniques to decrease the package size of this type of compound OVA.

In a specific embodiment, the vendor site includes a packaging server 137. The packaging server is responsible for generating 142 a compact version 135' of the virtual appliance for download by the customer. A file size of the compact version of the virtual appliance may be significantly less than a file size of the complete, full, or expanded version of the virtual appliance. As a result, the compact version of the virtual appliance requires much less network bandwidth and other computing resources when transmitting from the vendor to customer site as compared to the complete version of the virtual appliance. In turn, the transmission can be completed in less time and problems associated with transferring large amounts of data across networks can be avoided. The compact version of the virtual appliance may be referred to as an incomplete version of the virtual appliance because it will be missing parts required to properly run the virtual appliance.

In a specific embodiment, a reconstruction utility, script, metadata, or code module 140 accompanies or is included with a download 145 of the compact version of the virtual appliance to storage 146 of the customer site. The reconstruction utility, upon launching or starting at the customer site, is responsible reconstructing 147 a complete or intact version of compound virtual appliance file 135. In a specific embodiment, the reconstruction includes communicating with a virtual machine manager 150 of the customer site to direct and instruct the virtual machine manager on how to reconstruct the complete version of the compound virtual appliance from the compact (e.g., incomplete) version of the compound virtual appliance. In other specific embodiments, the reconstruction may be completed without communicating with the virtual machine manager.

The reconstruction utility may issue commands or other instructions and provide information or metadata to the virtual machine manager via an application programming interface (API) exposed by the virtual machine manager in order to instruct and direct the virtual machine manager on how the virtual appliance should be reconstructed into its complete form. In a specific embodiment, the virtual machine manager is vCenter as provided by VMware. While specific embodiments are described in conjunction with vCenter, it should be appreciated that the described systems and techniques can be applied to other virtual environment managers provided by other virtualization platform vendors (e.g., Hyper-V as provided by Microsoft Corporation).

In a specific embodiment, compacting the virtual appliance is for purposes of reducing file size for transit. That is, the virtual appliance will not execute properly until it has been reconstructed into its original pre-compact form and size.

Once the virtual appliance has been reconstructed at the customer site, the compound virtual appliance, or more particularly other virtual appliance components within the compound virtual appliance, can continue to be deployed across various virtual machines 155A-N of the customer's virtual machine cluster.

In a specific embodiment, the reconstruction is transparent or invisible to the customer. The reconstruction can launch or start automatically such that an end result includes one or more complete and intact virtual appliances from a compound virtual appliance that are ready for further deployment at the customer site. The customer can realize the benefits of the compact compound virtual appliance without having to learn new procedures or change standard operating practices.

Figure 2:
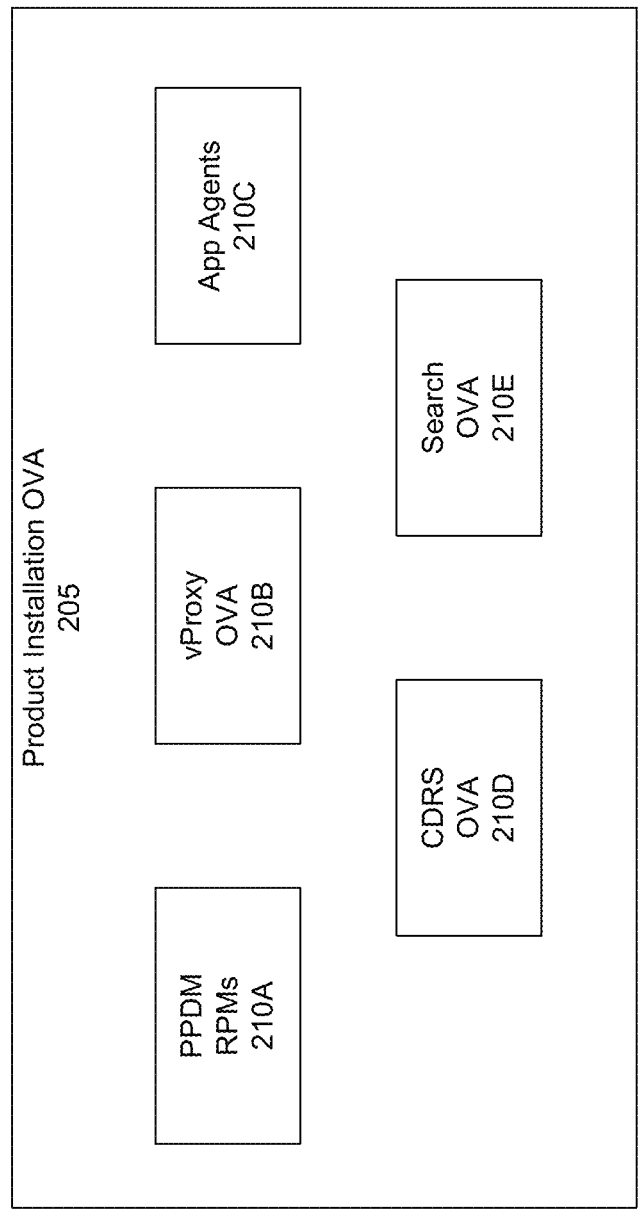
FIG. 2 shows a block diagram of a compound virtual appliance, according to one or more embodiments.

FIG. 2 shows an example of a compound OVA 205. In the example shown in FIG. 2, the compound OVA is an installation package for a data protection application that may be referred to as ProtectPoint by Dell EMC. The application includes several components 210A-E which are also packaged as OVA files in the compound OVA. A component may be referred to as a sub-component. In the example shown in FIG. 2, the installation package includes a PowerProtect Data Manager (PPDM) OVA 210A, vProxy OVA 210B, app agents OVA 210C, cloud disaster recovery server (CDRS) OVA 210D, and search OVA 210E. Each particular component may be hosted by a respective particular virtual machine. For example, a first component of the application may be hosted by a first VM, a second component of the application may be hosted by a second VM different from the first VM, a third component of the application may be hosted by a third VM different from the first and second VMs, and so forth.

For example, after the application contained within the compound OVA is deployed as a virtual machine at the customer site, the customer can use a user interface (UI) of the application to deploy a search VM using the search OVA, deploy the vProxy using the vProxy OVA, and so forth. That is, there is the core or master product itself and there can be other components or sub-components. In some cases, at least some of the components may be optional. These components can provide additional features and options. For example, if a customer desires protection of their own vCenter, the customer can deploy the vProxy OVA. If the customer desires protection for a cloud-based environment, the customer can deploy the CDRS OVA. If the customer desires indexing and searching, the customer can deploy the search OVA, and so forth.

Figure 3:
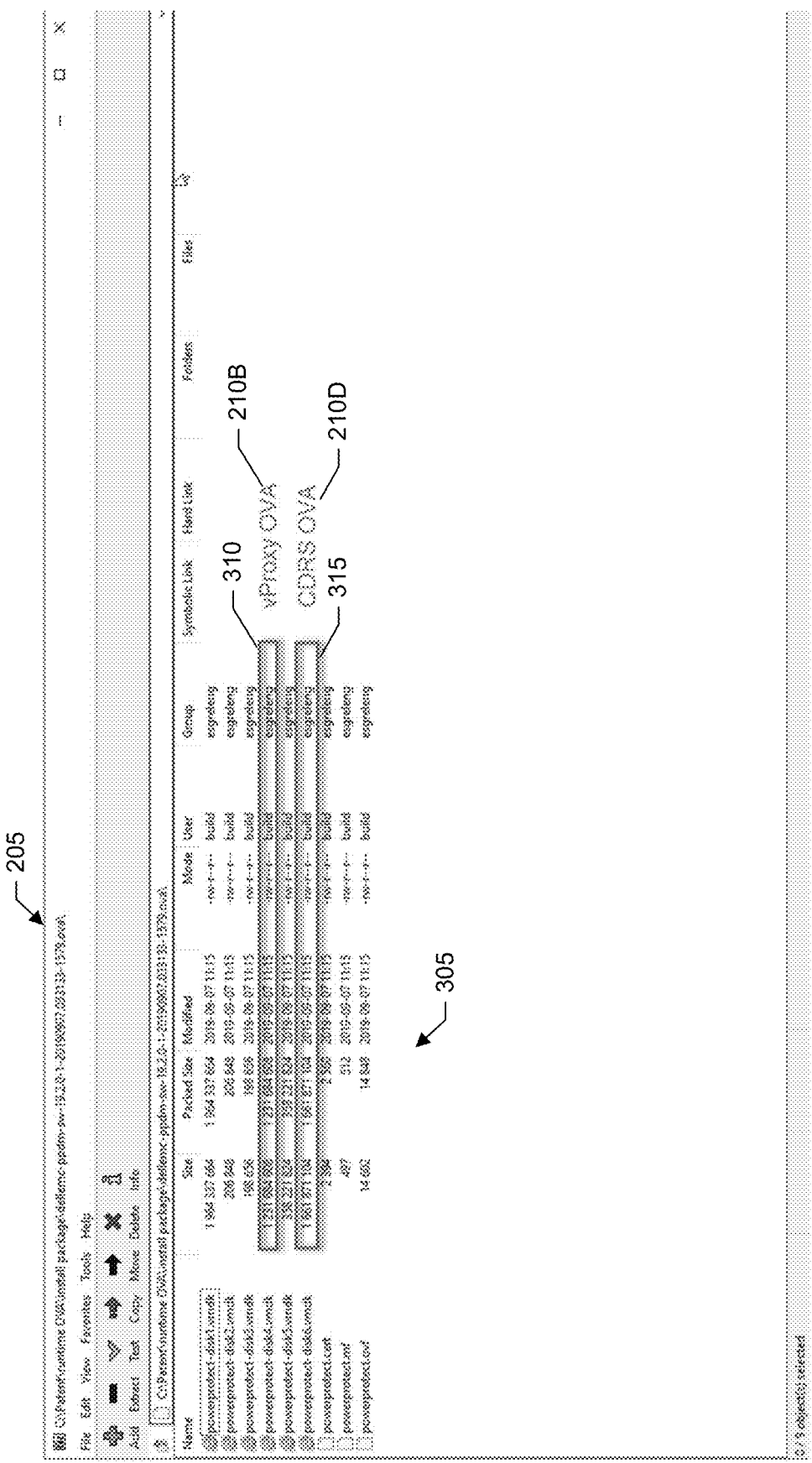
FIG. 3 shows a screenshot of items that may be contained within a compound virtual appliance, according to one or more embodiments.

FIG. 3 shows a screenshot listing items 305 that may be packaged into the compound OVA example shown in FIG. 2. The compound OVA includes the sub-components of the application packaged into their own individual separate OVAs. In particular, the sub-component OVAs are stored to separate virtual machine disks. In a specific embodiment, the virtual machine disks are formatted as .vmdk files. In this specific embodiment, a single sub-component OVA corresponds to a single virtual machine disk (e.g., .vmdk file). That is, a component or sub-component OVA may be wrapped or be encapsulated by a virtual machine disk (e.g., VMDK) wrapper.

For example, as shown in FIG. 3, the compound OVA includes virtual machine disk files 310 and 315. Virtual machine disk file 310 includes or stores vProxy OVA 210B. Virtual machine disk file 315 includes or stores CDRS OVA 210D. As discussed, a virtualization platform, such as VMware, can use any number of unzip tools to open an OVA file.

Figure 4:
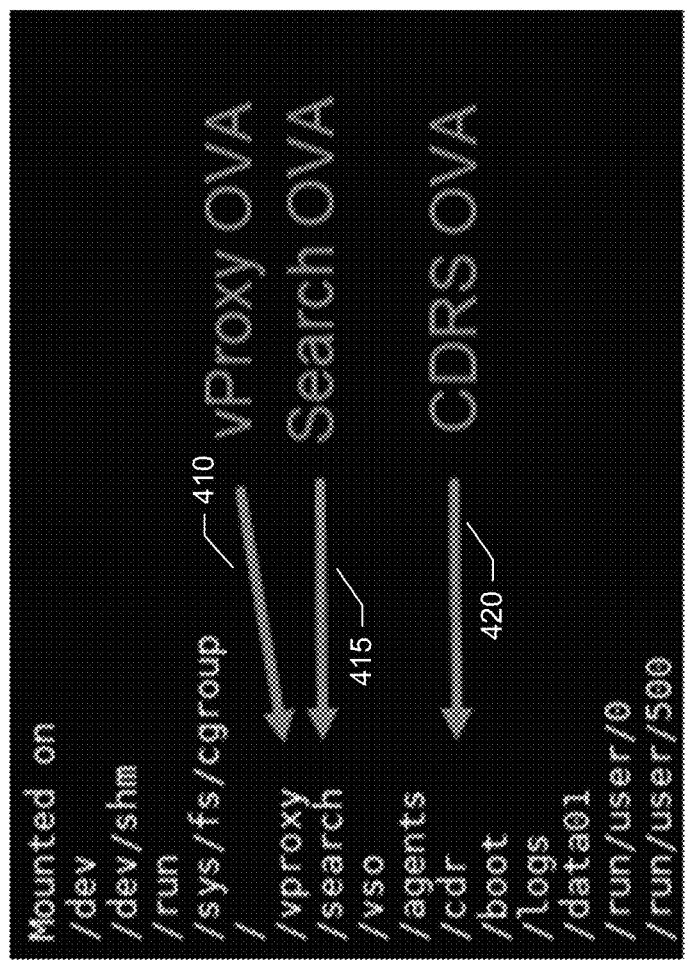
FIG. 4 shows a screenshot of unpacking a compound virtual appliance, according to one or more embodiments.

FIG. 4 shows a screenshot after deployment and unpacking of the compound OVA package shown in the example of FIG. 3. As shown in the example of FIG. 3, each sub-component's virtual machine disk file (e.g., .vmdk file) is mounted as a separate folder. Under or within the folder is the sub-component's OVA. These OVAs may be deployed as other VMs. For example, there is a folder 410 labeled "vproxy" which includes the vProxy OVA. There is a folder 415 labeled "search" which includes the Search OVA. There is a folder 420 labeled "cdr" which includes the CDRS OVA.

Figure 5:
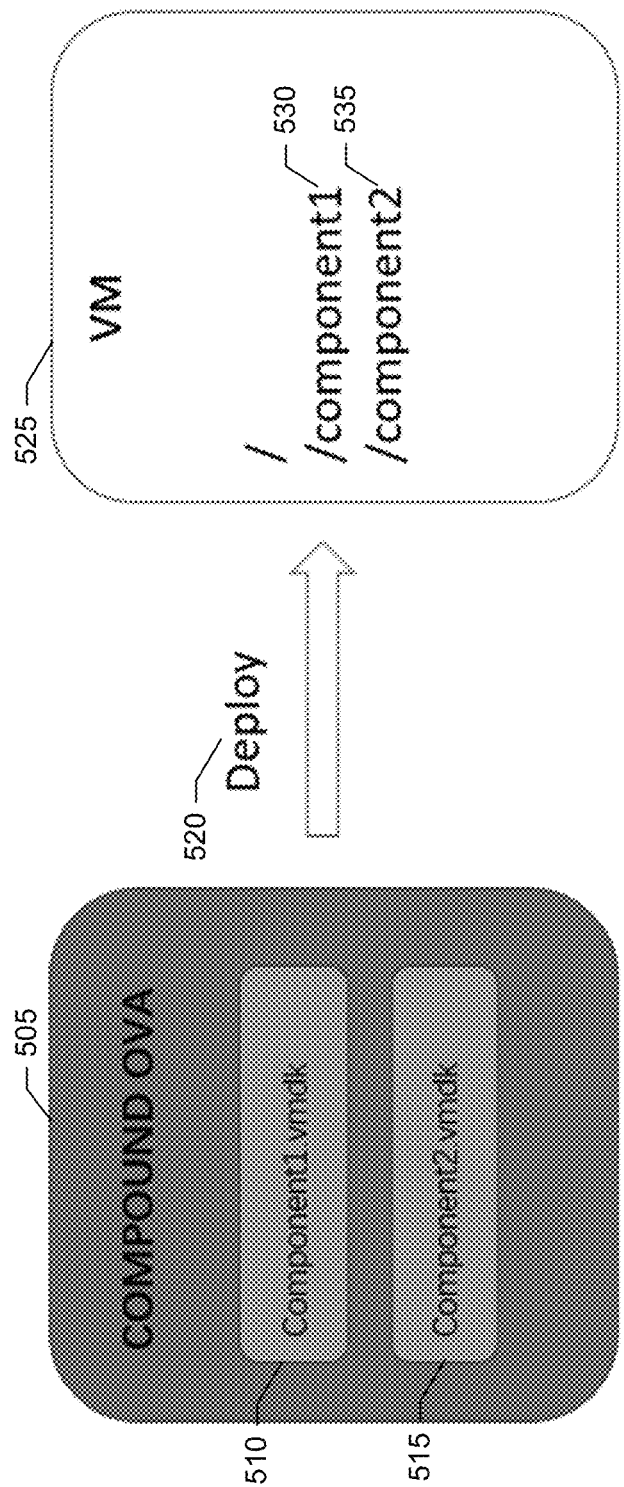
FIG. 5 shows a block diagram of unpacking components in a compound virtual appliance, according to one or more embodiments.

FIG. 5 shows a block diagram of a compound OVA package 505 for an application having first and second components or sub-components. Specifically, the compound OVA includes multiple sub-component OVAs that may be included as virtual machine disk files, e.g., "Component1.vmdk" 510 for the first component and "Component2.vmdk" 515 for the second component, in the package. After deploying 520 the compound OVA as a VM 525, each vmdk file is mounted as a separate folder. Each sub-component OVA is located in a respective folder. In particular, as shown in the example of FIG. 5, there is a folder 530 labeled "component1" within which an OVA for the first component is located. There is a folder 535 labeled "component2" within which an OVA for the second component is located.

Figure 6:
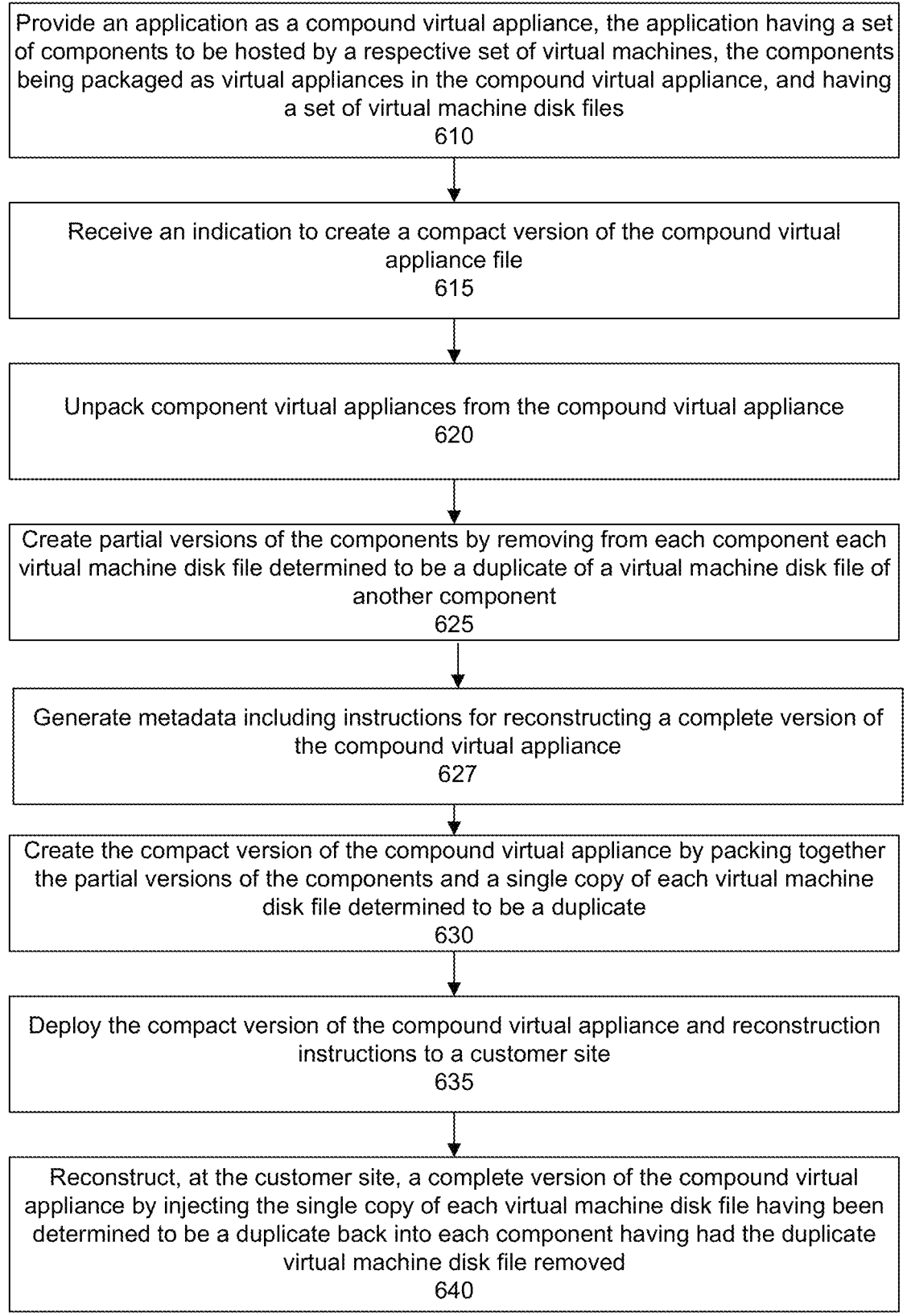
FIG. 6 shows an overall flow of a process for reducing a size of a compound virtual appliance, according to one or more embodiments.

FIG. 6 shows an overall flow of a process to decrease a size of a virtual appliance, and more particularly, a compound OVA file, for transmission from the vendor to the customer. Some specific flows are presented in this application, but it should be understood that the process is not limited to the specific flows and steps presented. For example, a flow may have additional steps (not necessarily described in this application), different steps which replace some of the steps presented, fewer steps or a subset of the steps presented, or steps in a different order than presented, or any combination of these. Further, the steps in other embodiments may not be exactly the same as the steps presented and may be modified or altered as appropriate for a particular process, application or based on the data.

In brief, systems and techniques are provided to share a common part of those OVAs and thus decrease a package size of the compound OVA. For example, in a specific embodiment, the multiple components or sub-components of an application may use the same operating system (OS). Using the same OS can facilitate OS updates and security hardening among other benefits. When two or more sub-components have the same OS version, a sub-component's OVA may include an OS that is a duplicate of an OS in another sub-component's OVA. Consider, as an example, that the OS part of each OVA may be about 1 gigabyte (GB) in size. Deduplicating this common part can result in a significant decrease in package size.

In a specific embodiment, a two phase process is employed. In this specific embodiment, there is a packaging phase and deployment phase. The packaging phase includes organizing each OVA's OS in a separate virtual machine disk and generating partial OVAs of the sub-components to deduplicate. The deployment phase includes restoring each sub-component's partial OVA.

Referring now to FIG. 6, in a step 610, an application is provided as a compound virtual appliance file. The application includes a set of components to be hosted by a respective set of virtual machines, each component including a set of virtual machine disk files.

In a step 615, an indication is received to create a compact version of the compound virtual appliance file. For example, once development of the application is completed and packaged into a compound virtual appliance file, the compound virtual appliance file may be moved into a packaging phase to create the compact version of the compound virtual appliance file. In a specific embodiment, the compact version of the compound virtual appliance file may be generated pre-request or before a customer requests a download of the application. This helps to ensure that the virtual appliance is immediately available in a pre-packaged compact format for transmission. In another specific embodiment, the compact version is generated after receiving a request from the customer for the application.

In a step 620, the compound virtual appliance is deconstructed. In particular, the component (or sub-component) virtual appliance files are unpacked from the compound virtual appliance file. In a step 625, partial versions of the components are created by removing from each component each virtual machine disk file determined to be a duplicate of a virtual machine disk file of another component. Duplicate virtual machine disk files may be determined by hashing or calculating hash values of the virtual machine disk files and comparing the hash values. Virtual machine disk files having identical hash values may be determined to be duplicates of each other. Virtual machine disk files not having identical hash values may be determined to not be duplicates of each other.

In a step 627, metadata is generated including instructions, properties, attribute values, parameters, or other information for reconstructing complete versions of the components and thus, ultimately, a complete version of the compound virtual appliance. The metadata may describe or specify, for example, a name of a folder corresponding to a component or sub-component of the application from which a duplicate virtual machine disk file was removed for transmission, an identification of the duplicate virtual machine disk file (e.g., name of the .vmdk) that should be placed back into the folder in order to reconstruct a complete version of the component. The removal of a virtual machine disk file (e.g., .vmdk) from a virtual appliance file of a component (e.g., .ova) is not accompanied by generating a reference in place of the removed virtual machine disk file. Indeed, an OVA does not provide a mechanism to reference a data unit externally.

In a step 630, the compact version of the virtual appliance file is created by packing together the partial versions of the components (or sub-components) and a single copy of each removed virtual machine disk file determined to be a duplicate.

In a step 635, the compact version of the virtual appliance file, including the reconstruction instructions and metadata, is deployed or transmitted to a customer site.

In a step 640, the complete version of the virtual appliance file is reconstructed at the customer site, according to the reconstruction instructions and metadata. The reconstruction includes adding, injecting or directing the injection of the single copy of each virtual machine disk file having been determined to be a duplicate back into each component having had the duplicate virtual machine disk file removed. Thus, after the reconstruction, there can be duplicate virtual machine disk files.

For example, there can be first and second components of an application that have had a virtual machine disk file, having been determined to be a duplicate, removed for transmission from the vendor to client site. For the transmission, a size of the first component is reduced by at least a size of the virtual machine disk file that was removed from the first component. Similarly, a size of the second component is reduced by at least a size of the virtual machine disk file that was removed from the second component. Upon reconstructing the first and second components at the customer site, the virtual machine disk file is added back to the first component; and the same virtual machine disk file is added back to the second component. That is, each of the first and second components have their own copy of the virtual machine disk file. A size of the first component will increase by at least a size of the added virtual machine disk file to the first component. Similarly, a size of the second component will increase by at least a size of the same added virtual machine disk file to the second component.

FIG. 7 shows a block diagram of an example for the packaging phase. There is a first component OVA 705A (e.g., Component1 OVA) and a second component OVA 705B (e.g., Component2 OVA). The first component OVA includes first and second virtual machine disk files 710A and 715A, respectively. The second component OVA includes third and fourth virtual machine disk files 710B and 715B, respectively. The first virtual machine disk file (e.g., "OS_disk.vmdk") includes an operating system. The second virtual machine disk file (e.g., "Component1_disk.vmdk") corresponds to code modules or logic specific or unique to the first component. The third virtual machine disk file (e.g., "OS_disk.vmdk") includes an operating system. The fourth virtual machine disk file (e.g., "Component2_disk.vmdk") corresponds to code modules or logic specific or unique to the second component.

These components are sub-components of a core application or product. For example, the product may be hosted by a particular VM. The first component or sub-component may be hosted by another particular VM. The second component or sub-component may be hosted by another particular VM. In this example, the main application or product VM and sub-component VMs have the same OS version. In a specific embodiment, a first step in the packaging phase includes creating for each sub-component OVA a separate virtual machine disk file (e.g., vmdk file) for the OS.

FIG. 8 shows a block diagram of a second step of the packaging phase for the example shown in FIG. 7. In the second step, an unpack tool, such as 7-zip, is used to unpack the component OVA. The virtual machine disk file for, in this example, the operating system (e.g., "OS_disk.vmdk") is removed from the component OVA. The pack tool is then used to pack the component OVA again (now without "OS_disk.vmdk" file).

As shown in the example of FIG. 8, broken lines are used to indicate virtual machine disk files 710A,B (corresponding to the OS disk file) having been removed from each respective component OVA.

The resulting OVA may be referred to as a partial component OVA. A partial component OVA or virtual appliance may include one or more virtual machine disks that are missing, omitted, or absent from the virtual appliance and are necessary or required for the virtual appliance to run.

In the example, shown in FIG. 8, there is a first partial version 705A' of the first component OVA. There is a second partial version 705B' of the second component OVA. As discussed, creating this partial OVA is for purposes of reducing package size for transmission. The partial OVA cannot be deployed for production use at the customer site. Systems and techniques are provided to ingest the missing virtual machine disk (e.g., OS_disk.vmdk) back to this partial OVA before use at the customer site.

Figure 9:
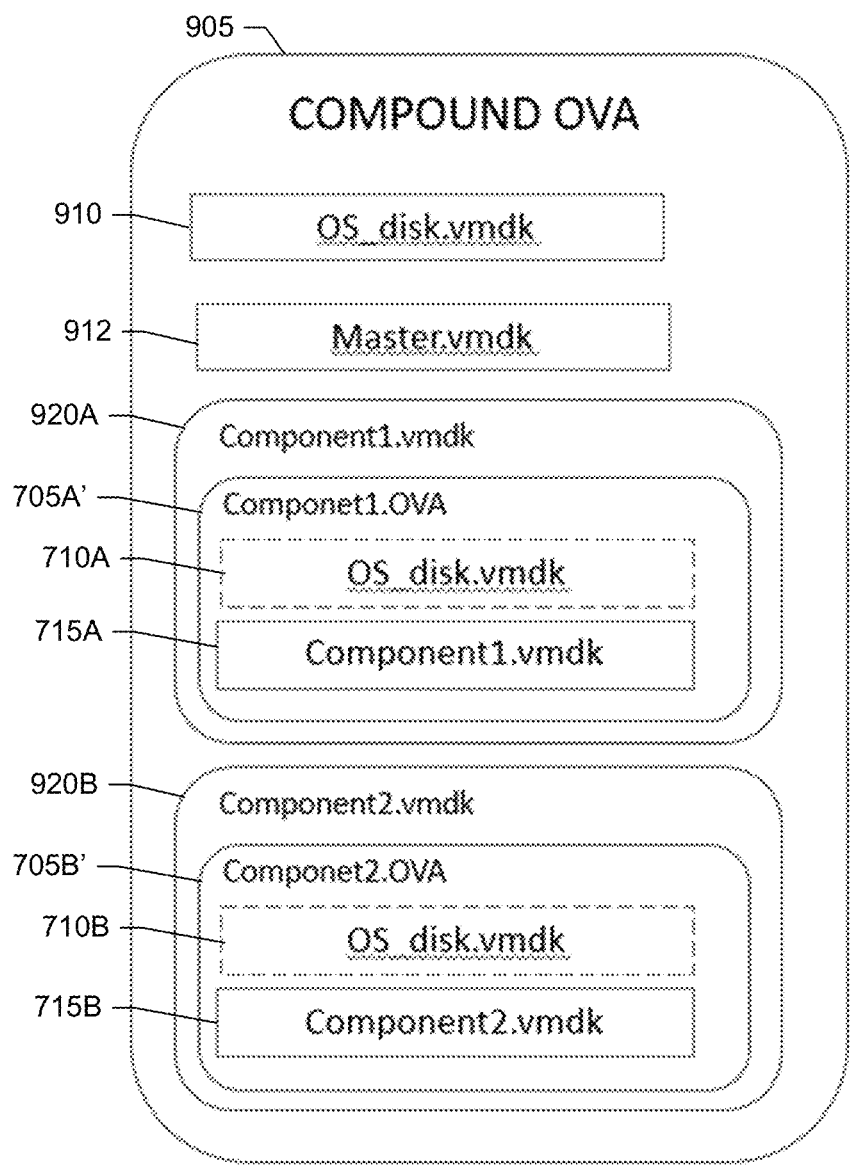
FIG. 9 shows a block diagram of a third step of the packaging phase, according to one or more embodiments.

FIG. 9 shows a block diagram of a third step of the packaging phase for the example shown in FIG. 7. The third step includes creating the product's compact version compound OVA 905. In this example, the compound OVA contains a single copy of a virtual machine disk file 910 (e.g., "OS_disk.vmdk" file) that was determined to be a duplicate, and each component's (or sub-component) wrapper VMDK file 920A, 920B. In other words, component OVAs may be packaged or wrapped as virtual machine disks in the compound OVA. The compound OVA may further include a virtual machine disk file 912, e.g., "Master.vmdk." The master virtual machine disk file may include the reconstruction utility and code modules and logic for managing and coordinating the different components or sub-components of the application.

Figure 10:
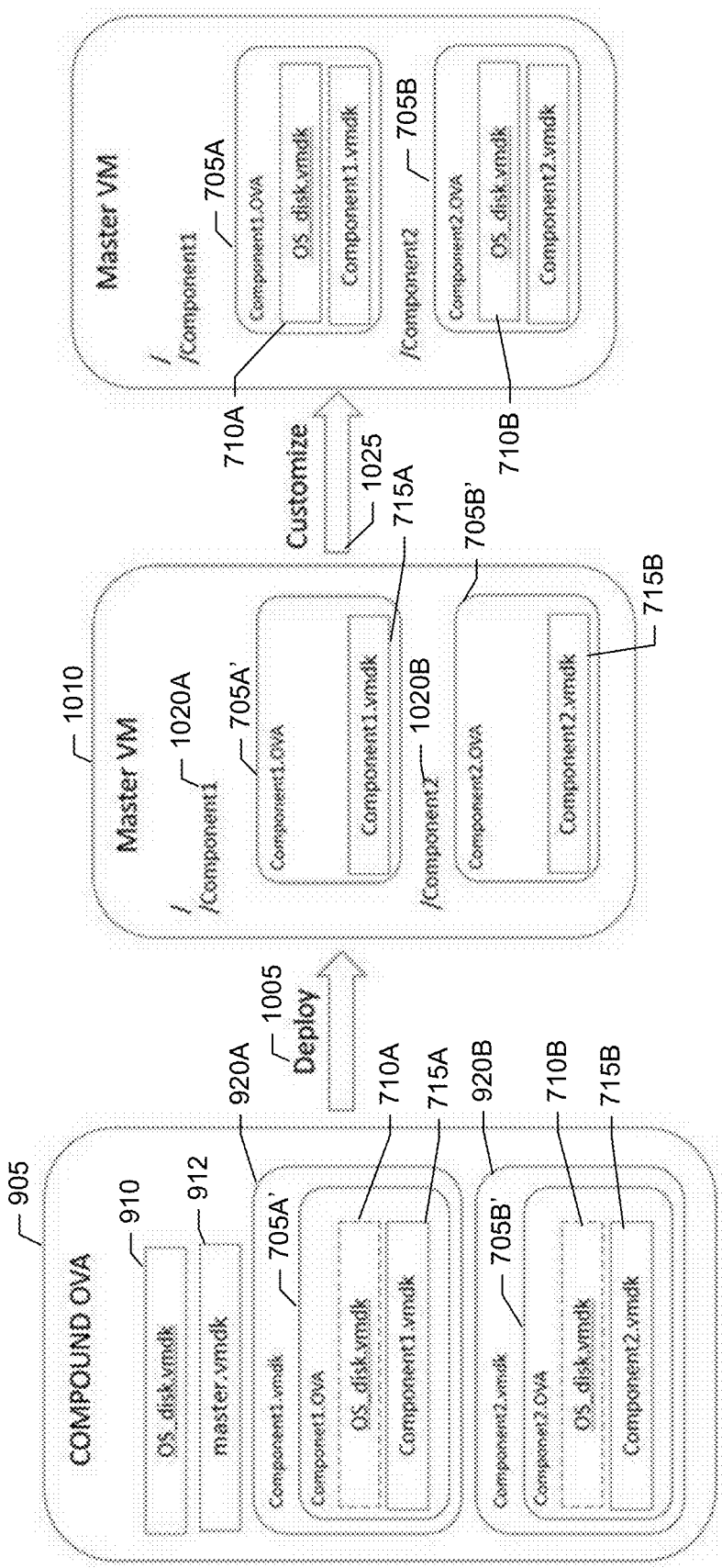
FIG. 10 shows a block diagram of a deployment phase, according to one or more embodiments.

The sub-component VMDK file, includes the partial component OVA file. At this stage, the compound OVA package size has been decreased dramatically by removing duplicate "OS_disk.vmdk" file (as indicated by the broken lines), thus obtaining a compact version of the compound OVA. The reconstruction utility allows for reconstructing at the customer site complete versions of the components or sub-components FIG. 10 shows a block diagram of a deployment phase for the example shown in FIG. 7. In a specific embodiment, the deployment phase provides for deploying the compact version compound OVA from the vendor to customer site. After the deployment, a reconstruction script provides instructions or steps to ingest the removed virtual machine disk file (e.g., "OS_disk.vmdk") back to each sub-component's OVA to create an intact OVA. Then the sub-component's OVA will be ready for future deployment at the customer site (e.g., deploying to respective virtual machines at the customer site).

More particularly, as shown in the example of FIG. 10, compact version compound OVA 905 is deployed 1005 as a master virtual machine 1010 at the customer site. Upon the deployment, each component or sub-component's virtual machine disk file 920A, 920B is mounted as a separate folder under which the component or sub-component's OVA is placed. For example, a first folder 1020A labeled "Component1" corresponds to a mounting of virtual machine disk file 920A for the first component. A second folder 1020B labeled "Component2" corresponds to a mounting of virtual machine disk file 920B for the second component.

Partial versions of the components are placed in their respective folders. For example, first OVA file 705A' corresponding to a partial version of the first component or sub-component is located in the first folder. Second OVA file 705B' corresponding to a partial version of the second component or sub-component is located in the second folder. As shown in the example of FIG. 10, first component OVA file 705A' includes virtual machine disk file 715A which is specific or unique to the first component. Similarly, second component OVA file 705B' includes virtual machine disk file 715B which is specific or unique to the second component. The virtual machine disk file having been determined to be a duplicate (e.g., "OS_disk.vmdk"), however, is not shown in OVA files 705A' and 705B' to indicate that the file is missing or absent.

In a specific embodiment, a reconstruction or customization step 1025 provides for injecting or adding back the removed virtual machine disk file (e.g., 710A and 710B) back into each component, thereby creating or recreating complete or intact versions 705A and 705B of the first and second components. These components can now be further deployed to respective virtual machines at the customer site.

In a specific embodiment, a method includes mounting, at the customer site, a virtual machine disk included in the compound virtual appliance as a first folder. The first folder includes a first virtual appliance. The first virtual appliance includes a first virtual machine disk specific to a first component of the application and does not include the duplicate virtual machine disk. The method may further include mounting, at the customer site, another virtual machine disk included in the compound virtual appliance as a second folder. The second folder includes a second virtual appliance. The second virtual appliance includes a second virtual machine disk specific to a second component of the application and does not include the duplicate virtual machine disk.

To recreate intact versions of the first and second components, the duplicate virtual machine disk included with the compound virtual appliance is added to the first and second folders, the first folder thereby now including the first virtual machine disk and the duplicate virtual machine disk, and the second folder thereby now including the second virtual machine disk and the same duplicate virtual machine disk. Upon the adding, the first virtual machine disk and the duplicate virtual machine disk is packed together to create an intact version of the first component. The second virtual machine disk and the duplicate virtual machine disk is packed together to create an intact version of the second component.

Figure 11:
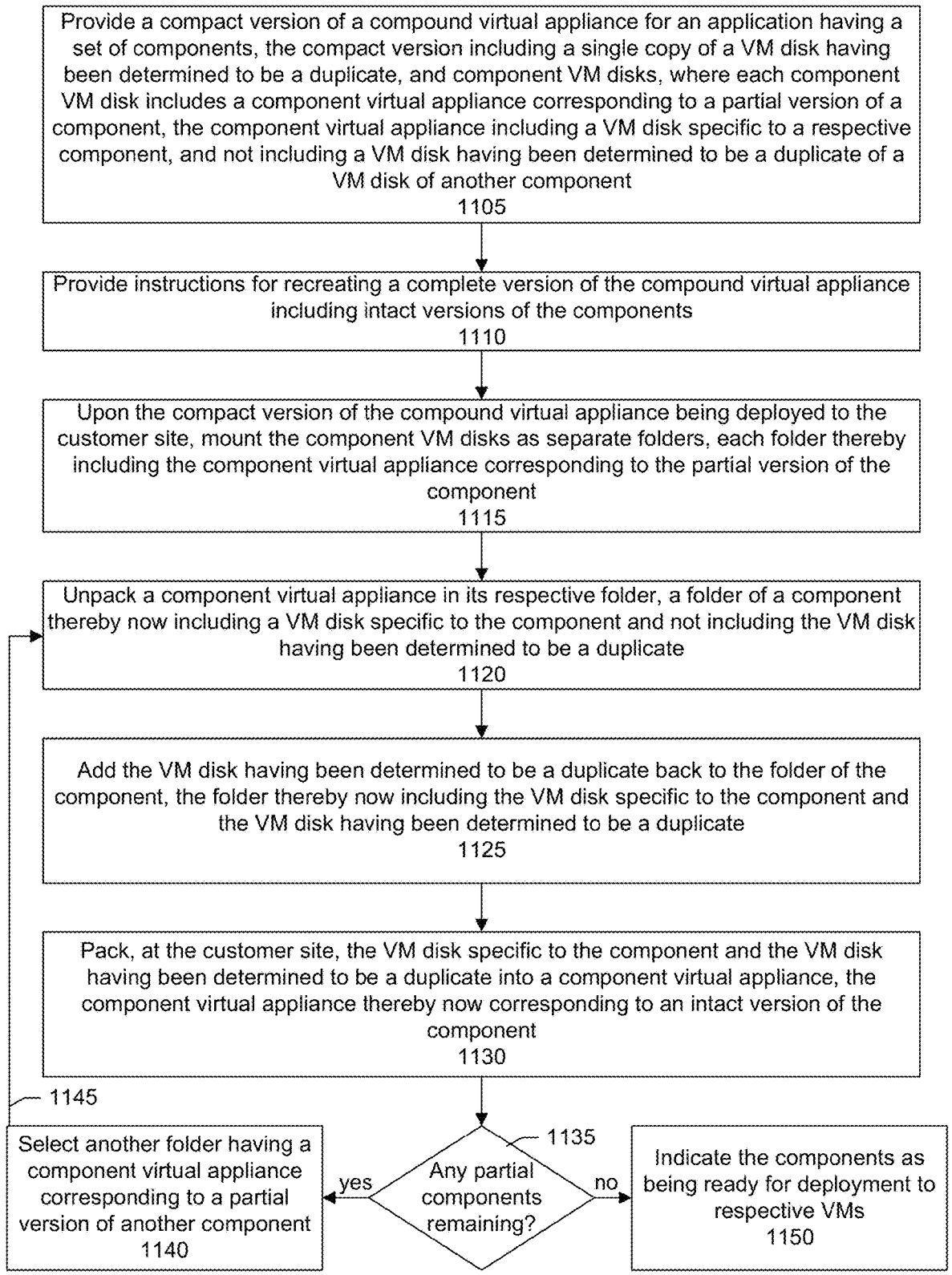
FIG. 11 shows a more detailed flow for reconstructing a complete version of a compound virtual appliance, according to one or more embodiments.

FIG. 11 shows further detail of a flow for reconstructing a complete version of a compound virtual appliance from a compact version according to one or more embodiments. In a step 1105, a compact version of a compound virtual appliance file for an application having a set of components is provided. The compact version includes a single copy of a virtual machine disk file having been determined to be a duplicate, and component virtual machine disks. Each component virtual machine disk includes a component virtual appliance file corresponding to a partial version of a component. The component virtual appliance files includes a virtual machine disk file specific or unique to a respective component, and does not include a virtual machine disk file that has been determined to be a duplicate of a virtual machine disk file of another component.

In a step 1110, instructions are provided for recreating the complete version of the compound virtual appliance including intact versions of the components.

In a step 1115, upon the compact version of the compound virtual appliance file being deployed to the customer site, along with the instructions, component virtual machine disks in the compound virtual appliance are mounted as separate folders, each folder thereby including the component virtual appliance file corresponding to the partial version of the component.

In a step 1120, a component virtual appliance file is unpacked in its respective folder. Upon the unpacking of the component virtual appliance file, the folder thereby now includes a virtual machine disk file specific to the component, but does not include the virtual machine disk file having been determined to be a duplicate (and thus having been removed during the packaging phase at the vendor site)—see, e.g., FIG. 10, components 705A' and 705B' at master VM 1010.

In a step 1125, the virtual machine disk having been determined to be a duplicate and removed for transmission, is added back or injected to the folder of the component. The folder thereby now includes the virtual machine disk having been determined to be a duplicate and the virtual machine disk file specific to the component.

In a step 1130, the virtual machine disk file specific to the component and the virtual machine disk file having been determined to be a duplicate is packed into a component virtual appliance. The component virtual appliance file at the customer site thereby now corresponds to an intact or complete version of the component—see, e.g., FIG. 10, components 705A and 705B at master VM 1010.

As discussed, in a specific embodiment, there are multiple OVAs included on the main product VM, which are used to deploy one or more instances of remote components on customer demand. The OVA is the format accepted by vCenter when deploying a VM. During the initial packaging phase these component OVAs are modified to remove the "common" disks (e.g., OS disks) to reduce the size of the overall file while the customer is downloading it to their environment. But once the product is running, in order for them to deploy those component OVAs, the OS disk (or other missing duplicate disk) needs to be added back to the OVA, or the deployed VM will not have a OS disk.

In a step 1135, a determination is made as to whether there are any other partial components remaining. If so, in a step 1140, another folder having a component virtual appliance file corresponding to a partial version of another component is selected and the process loops back 1145 to step 1120 to repeat the unpacking of the component virtual appliance, adding back the removed duplicate virtual machine disk file, and the repacking of the added duplicate virtual machine disk file along with a virtual machine disk file specific or unique to the component.

Alternatively, if there are no other partial components remaining, in a step 1150, the components are indicated as being ready for deployment to respective virtual machines at the customer site (step 1150). For example, a status message may be displayed through a user interface of the master virtual machine indicating that the components of the application are now ready to be deployed to their respective virtual machines.

FIG. 12 shows an example of custom properties or metadata 1205 that may be passed to the virtual machine manager when deploying the compound virtual appliance.

As discussed, in a specific embodiment, the virtual machine manager is vCenter as provided by VMware. In this specific embodiment, VMware's custom property parameter is leveraged to pass in the metadata information as a JavaScript Object Notation (json) string. JSON is a lightweight format for storing and transporting data.

The metadata includes: i) for each virtual machine disk file (e.g., vmdk file), which folder they are to be mounted (see e.g., 1210A); ii) after virtual machine startup, an identification of the script to be run 1220; and iii) vCenter hosting information or credentials 1225.

Thus, in the example shown in FIG. 12, a mount folder for the first component is "/Component1." The script to be run after VM startup is identified as "/Master/init/config.sh." The vCenter hosting information or credentials includes an Internet Protocol (IP) address for the vCenter hosting the master VM (e.g., "10.12.12.12"), vCenter username (e.g., "admin"), and vCenter password (e.g., "abc123").

When the master VM is deployed and powered on, a service is started on boot that reads the custom properties and runs the startup script (e.g., "startup script"). The script includes instructions for reconstructing the complete version of the virtual appliance including generating intact versions of the component virtual appliance files. More particularly, in a specific embodiment, the script gets vCenter information which hosts the master VM, gets the Master VMs virtual machine disk file (i.e., the duplicate virtual machine disk file that was removed from the components for transport, e.g., "OS_disk.vmdk") and downloads it.

The following steps are then repeated for each component: i) unpack a component virtual appliance file (e.g., component OVA file); ii) add the duplicate virtual machine disk file back (e.g., "OS_disk.vmdk"); and iii) pack the component virtual appliance or OVA file again. Upon completion, of the steps, the component or sub-component's OVA is now intact and can be deployed.

Benefits of the systems and techniques described include decreasing a size of a product installation (or upgrade) package by removing multiple duplicate virtual machine disk files (e.g., OS_disk file); and ensuring that the final deployed VM contains the same component virtual appliance (e.g., OVA) as in the complete version of compound virtual appliance, thereby having no impact to the following workflow. That is, the customer will not have to change any of their current workflows or practices to realize the benefits of the compact virtual appliance file. The compact virtual appliance file is automatically reconstructed to its complete version including intact component virtual appliances that are ready for deployment to respective virtual machines.

In a specific embodiment, a compound OVA includes multiple sub-component OVAs, each sharing a same operating system version. In this specific embodiment, systems and techniques are provided to deduplicate common OS disks of the compound OVA. Systems and techniques allowing for packaging only one OS_disk into the installation package. Other sub-component OVAs do not have the OS_disk. Systems and techniques are provided to inject the OS disk back to the sub-component OVAs when deploying the compound OVA.

In some cases, it will not be necessary to communicate with the virtual machine manager (e.g., vCenter) as shown in FIG. 12 in order to reconstruct a complete version of the compound virtual appliance file. For example, FIGS. 13-17 show command line screenshots for an example on how to remove a virtual machine disk file (e.g., VMDK disk) from a VMWare OVA using VMWare's ovftool, and then inject it back in later—without having to communicate with vCenter.

The tool may be included with a shipment of the compound virtual appliance. In particular, FIG. 13 shows an OVA (e.g., "test.ova"). FIG. 14 shows an example of using ovftool to extract the OVA into its component parts.

FIG. 15 shows, upon the extraction, the disks and other files that comprise the OVA, e.g., "test-disk1.vmdk," "test-disk2.vmdk," "test-disk3.vmdk," "test-disk4.vmdk," "test.mf," and "test.ovf." Consider, as an example, that the common OS_disk is disk 1. FIG. 16 shows an example of removing the OS_disk. The remaining files can then be included in the product OVA for shipping or distribution to the customer. When the product OVA (e.g., PPDM OVA) is powered on by the customer, a script is run that copies back the disk1.vmdk, and then reconstructs the OVA using ovftool again (FIG. 17).

The procedure shown in FIGS. 13-17 can be used in cases where there exists a shared OS_disk as a separate VMDK file within the overall product OVA (i.e., compound OVA). If, however, the compound OVA has an OS_disk that is the same as the component OVAs, it is desirable to deduplicate that as well. In that case, vCenter is contacted to obtain the vmdk, since access to a disk that is currently in use and running is blocked. Thus, the hosting vCenter credentials shown in FIG. 12 are needed.

For example, as shown in the example of FIG. 10, the same OS_disk is used in the compound OVA and the component OVAs. The OS disks from the component OVAs are removed for transmission (see, e.g., FIGS. 13-16).

When the compound OVA is brought up in the customer system, it is actively running its own OS_disk. So, the reconstruction utility reaches out to the vCenter that is hosting the VM to extract the OS_disk from there, and then inject it into the component OVAs. vCenter APIs can be used for such operations.

Embodiments have been described in which OS disks were identified as being duplicates and thus removed from the components for transmission. It should be appreciated, however, that the system and techniques described can be applied to any common disks such as disks having tools that may be the same for two or more virtual appliance files in a compound virtual appliance file.

In a specific embodiment, there is a method comprising: providing an application as a virtual appliance file, the virtual appliance file comprising a plurality of components for the application that will be hosted by a plurality of virtual machines, each component comprising a plurality of virtual machine disk files; creating partial versions of the plurality of components by removing from each component each virtual machine disk file determined to be a duplicate of a virtual machine disk file of another component; creating a compact version of the virtual appliance file by compressing the partial versions of the plurality of components and a single copy of each virtual machine disk file having been determined to be a duplicate into an archive file; deploying the archive file to a customer site; and after the deployment, reconstructing the virtual appliance file from the archive file by injecting the single copy of each virtual machine disk file having been determined to be a duplicate back into each component having had the duplicate virtual machine disk file removed.

In a specific embodiment, there is a method comprising: providing an application as a compound virtual appliance, the compound virtual appliance comprising a plurality of components for the application that will be hosted by a plurality of virtual machines, each component comprising a plurality of virtual machine disks; creating partial versions of the plurality of components by removing from each component each virtual machine disk determined to be a duplicate of a virtual machine disk of another component; creating a compact version of the compound virtual appliance by packing together the partial versions of the plurality of components and a single copy of each virtual machine disk having been determined to be a duplicate; deploying the compact version of the compound virtual appliance to a customer site; and reconstructing, at the customer site, a complete version of the compound virtual appliance by adding back the single copy of each virtual machine disk having been determined to be a duplicate into each component having had the duplicate virtual machine disk removed.

The method may further include: mounting, at the customer site, a virtual machine disk included in the compound virtual appliance as a first folder, the first folder comprising a first virtual appliance, wherein the first virtual appliance comprises a first virtual machine disk specific to a first component of the application and does not comprise the duplicate virtual machine disk; unpacking the first virtual appliance in the first folder; adding the duplicate virtual machine disk to the first folder, the first folder thereby now comprising the duplicate virtual machine disk and the first virtual machine disk specific to the first component; and packing the duplicate virtual machine disk and the first virtual machine disk specific to the first component together to create an intact version of the first component.

The method may further include: mounting, at the customer site, another virtual machine disk included in the compound virtual appliance as a second folder, the second folder comprising a second virtual appliance, wherein the second virtual appliance comprises a second virtual machine disk specific to a second component of the application and does not comprise the duplicate virtual machine disk; unpacking the second virtual appliance in the second folder; adding the duplicate virtual machine disk to the second folder, the second folder thereby now comprising the duplicate virtual machine disk and the second virtual machine disk specific to the second component; and packing the duplicate virtual machine disk and the second virtual machine disk specific to the second component together to create an intact version of the second component.

In an embodiment, a first component of the application is to be deployed as a first virtual machine, and a second component of the application is to be deployed as a second virtual machine. In an embodiment, the virtual appliance is formatted as an Open Virtual Appliance (OVA) file. In an embodiment, the compact version of the compound virtual appliance comprises the duplicate virtual machine disk, a first virtual appliance, and a second virtual appliance, the first virtual appliance corresponding to a first component of the application, and the second virtual appliance corresponding to a second component of the application, wherein the first virtual appliance is packaged as a virtual machine disk in the compound virtual appliance, and the second virtual appliance is packaged as another virtual machine disk in the compound virtual appliance, and wherein the duplicate virtual machine disk is omitted from the first and second virtual appliances.

In another specific embodiment, there is a system comprising: a processor; and memory configured to store one or more sequences of instructions which, when executed by the processor, cause the processor to carry out the steps of: providing an application as a compound virtual appliance, the compound virtual appliance comprising a plurality of components for the application that will be hosted by a plurality of virtual machines, each component comprising a plurality of virtual machine disks; creating partial versions of the plurality of components by removing from each component each virtual machine disk determined to be a duplicate of a virtual machine disk of another component; creating a compact version of the compound virtual appliance by packing together the partial versions of the plurality of components and a single copy of each virtual machine disk having been determined to be a duplicate; deploying the compact version of the compound virtual appliance to a customer site; and reconstructing, at the customer site, a complete version of the compound virtual appliance by adding back the single copy of each virtual machine disk having been determined to be a duplicate into each component having had the duplicate virtual machine disk removed.

In another specific embodiment, there is a computer program product, comprising a non-transitory computer-readable medium having a computer-readable program code embodied therein, the computer-readable program code adapted to be executed by one or more processors to implement a method comprising: providing an application as a compound virtual appliance, the compound virtual appliance comprising a plurality of components for the application that will be hosted by a plurality of virtual machines, each component comprising a plurality of virtual machine disks; creating partial versions of the plurality of components by removing from each component each virtual machine disk determined to be a duplicate of a virtual machine disk of another component; creating a compact version of the compound virtual appliance by packing together the partial versions of the plurality of components and a single copy of each virtual machine disk having been determined to be a duplicate; deploying the compact version of the compound virtual appliance to a customer site; and reconstructing, at the customer site, a complete version of the compound virtual appliance by adding back the single copy of each virtual machine disk having been determined to be a duplicate into each component having had the duplicate virtual machine disk removed.

Figure 18:
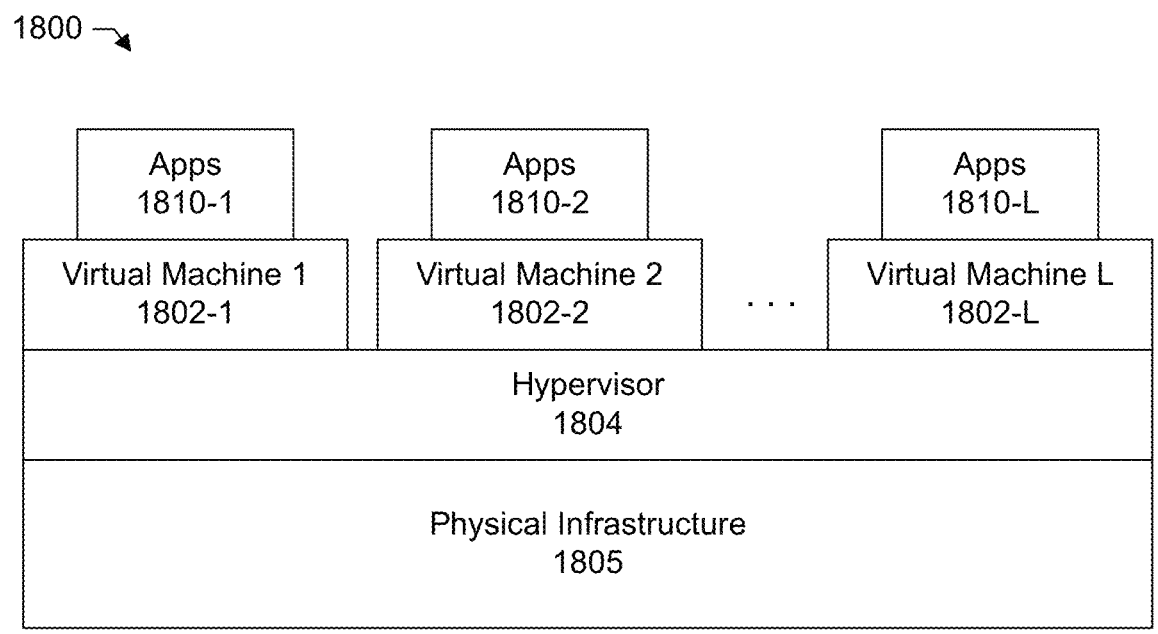
FIG. 18 shows a block diagram of a processing platform that may be utilized to implement at least a portion of an information processing system, according to one or more embodiments.

FIG. 18 shows an example processing platform comprising cloud infrastructure 1800. The cloud infrastructure 1800 comprises a combination of physical and virtual processing resources that may be utilized to implement at least a portion of the information processing system 100. The cloud infrastructure 1800 comprises virtual machines (VMs) 1802-1, 1802-2, . . . 1802-L implemented using a hypervisor 1804. The hypervisor 1804 runs on physical infrastructure 1805. The cloud infrastructure 1800 further comprises sets of applications 1810-1, 1810-2, . . . 1810-L running on respective ones of the virtual machines 1802-1, 1802-2, . . . 1802-L under the control of the hypervisor 1804.

Although only a single hypervisor 1804 is shown in the embodiment of FIG. 18, the system 100 may of course include multiple hypervisors each providing a set of virtual machines using at least one underlying physical machine. Different sets of virtual machines provided by one or more hypervisors may be utilized in configuring multiple instances of various components of the system 100.

An example of a commercially available hypervisor platform that may be used to implement hypervisor 1804 and possibly other portions of the information processing system 100 in one or more embodiments is the VMware® vSphere® which may have an associated virtual infrastructure management system such as the VMware® vCenter™. The underlying physical machines may comprise one or more distributed processing platforms that include one or more storage systems.

Figure 19:
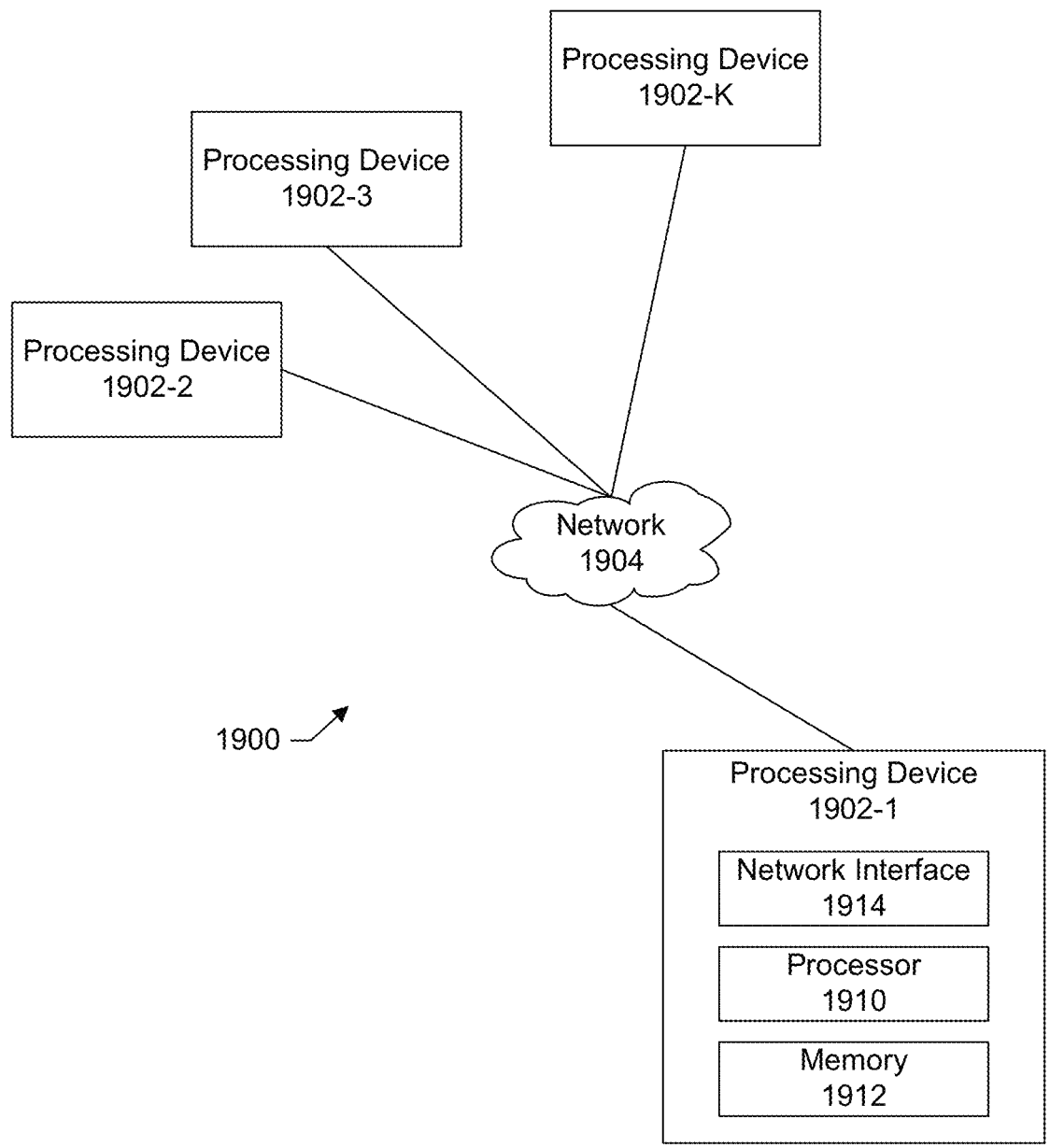
FIG. 19 shows another block diagram of a processing platform that may be utilized to implement at least a portion of an information processing system, according to one or more embodiments.

As is apparent from the above, one or more of the processing modules or other components of system 100 may each run on a computer, server, storage device or other processing platform element. A given such element may be viewed as an example of what is more generally referred to herein as a "processing device." The cloud infrastructure 1800 shown in FIG. 18 may represent at least a portion of one processing platform. Another example of such a processing platform is processing platform 1900 shown in FIG. 19.

The processing platform 1900 in this embodiment comprises a portion of system 190 and includes a plurality of processing devices, denoted 1902-1, 1902-2, 1902-3, ... 1902-K, which communicate with one another over a network 1904.

The network 1904 may comprise any type of network, including by way of example a global computer network such as the Internet, a WAN, a LAN, a satellite network, a telephone or cable network, a cellular network, a wireless network such as a WiFi or WiMAX network, or various portions or combinations of these and other types of networks.

The processing device 1902-1 in the processing platform 1900 comprises a processor 1910 coupled to a memory 1912.

The processor 1910 may comprise a microprocessor, a microcontroller, an application-specific integrated circuit (ASIC), a field-programmable gate array (FPGA) or other type of processing circuitry, as well as portions or combinations of such circuitry elements.

The memory 1912 may comprise random access memory (RAM), read-only memory (ROM) or other types of memory, in any combination. The memory 1912 and other memories disclosed herein should be viewed as illustrative examples of what are more generally referred to as "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 1902-1 is network interface circuitry 1914, which is used to interface the processing device with the network 1904 and other system components, and may comprise conventional transceivers.

The other processing devices 1902 of the processing platform 1900 are assumed to be configured in a manner similar to that shown for processing device 1902-1 in the figure.

Again, the particular processing platform 1900 shown in the figure is presented by way of example only, and system 100 may include additional or alternative processing platforms, as well as numerous distinct processing platforms in any combination, with each such platform comprising one or more computers, servers, storage devices or other processing devices.

For example, other processing platforms used to implement illustrative embodiments can comprise different types of virtualization infrastructure, in place of or in addition to virtualization infrastructure comprising virtual machines. Such virtualization infrastructure illustratively includes container-based virtualization infrastructure configured to provide Docker containers or other types of LXCs.

As another example, portions of a given processing platform in some embodiments can comprise converged infrastructure such as VxRail™, VxRack™, VxRack™ FLEX, VxBlock™, or Vblock® converged infrastructure from VCE, the Virtual Computing Environment Company, now the Converged Platform and Solutions Division of Dell EMC.

It should therefore be understood that in other embodiments different arrangements of additional or alternative elements may be used. At least a subset of these elements may be collectively implemented on a common processing platform, or each such element may be implemented on a separate processing platform.

Also, numerous other arrangements of computers, servers, storage devices or other components are possible in the information processing system 100. Such components can communicate with other elements of the information processing system 100 over any type of network or other communication media.

As indicated previously, components of an information processing system as disclosed herein can be implemented at least in part in the form of one or more software programs stored in memory and executed by a processor of a processing device. For example, at least portions of the functionality of one or more components of the compute services platform 100 are illustratively implemented in the form of software running on one or more processing devices.

Figure 20:
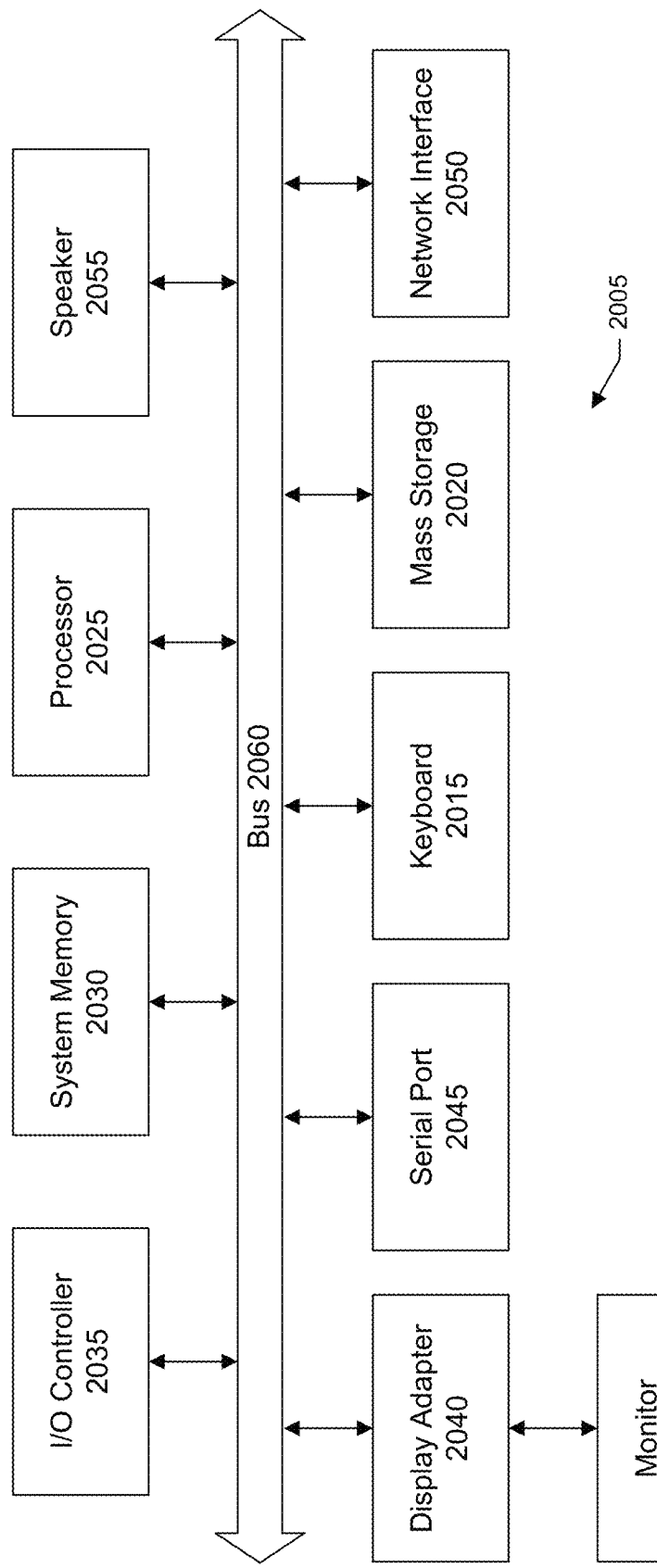
FIG. 20 shows a block diagram of a computer system suitable for use with the system, according to one or more embodiments.

FIG. 20 shows a system block diagram of a computer system 2005 used to execute the software of the present system described herein. The computer system includes a monitor 2007, keyboard 2015, and mass storage devices 2020. Computer system 2005 further includes subsystems such as central processor 2025, system memory 2030, input/output (I/O) controller 2035, display adapter 2040, serial or universal serial bus (USB) port 2045, network interface 2050, and speaker 2055. The system may also be used with computer systems with additional or fewer subsystems. For example, a computer system could include more than one processor 2025 (i.e., a multiprocessor system) or a system may include a cache memory.

Arrows such as 2060 represent the system bus architecture of computer system 2005. However, these arrows are illustrative of any interconnection scheme serving to link the subsystems. For example, speaker 2055 could be connected to the other subsystems through a port or have an internal direct connection to central processor 2025. The processor may include multiple processors or a multicore processor, which may permit parallel processing of information. Computer system 2005 shown in FIG. 20 is but an example of a computer system suitable for use with the present system. Other configurations of subsystems suitable for use with the present invention will be readily apparent to one of ordinary skill in the art.

Computer software products may be written in any of various suitable programming languages. The computer software product may be an independent application with data input and data display modules. Alternatively, the computer software products may be classes that may be instantiated as distributed objects. The computer software products may also be component software.

An operating system for the system may be one of the Microsoft Windows®. family of systems (e.g., Windows Server), Linux, Mac OS X, IRIX32, or IRIX64. Other operating systems may be used. Microsoft Windows is a trademark of Microsoft Corporation.

Furthermore, the computer may be connected to a network and may interface to other computers using this network. The network may be an intranet, internet, or the Internet, among others. The network may be a wired network (e.g., using copper), telephone network, packet network, an optical network (e.g., using optical fiber), or a wireless network, or any combination of these. For example, data and other information may be passed between the computer and components (or steps) of a system of the invention using a wireless network using a protocol such as Wi-Fi (IEEE standards 802.11, 802.11a, 802.11b, 802.11e, 802.11g, 802.11i, 802.11n, 802.11ac, and 802.11ad, just to name a few examples), near field communication (NFC), radio-frequency identification (RFID), mobile or cellular wireless. For example, signals from a computer may be transferred, at least in part, wirelessly to components or other computers.

In the description above and throughout, numerous specific details are set forth in order to provide a thorough understanding of an embodiment of this disclosure. It will be evident, however, to one of ordinary skill in the art, that an embodiment may be practiced without these specific details. In other instances, well-known structures and devices are shown in block diagram form to facilitate explanation. The description of the preferred embodiments is not intended to limit the scope of the claims appended hereto. Further, in the methods disclosed herein, various steps are disclosed illustrating some of the functions of an embodiment. These steps are merely examples, and are not meant to be limiting in any way. Other steps and functions may be contemplated without departing from this disclosure or the scope of an embodiment. Other embodiments include systems and non-volatile media products that execute, embody or store processes that implement the methods described above.

What is claimed is:

1. A method comprising:
providing an application as a compound virtual appliance, the compound virtual appliance comprising a plurality of components for the application that will be hosted by a plurality of virtual machines, each component comprising a plurality of virtual machine disks;
creating partial versions of the plurality of components by removing from each component each virtual machine disk determined to be a duplicate of a virtual machine disk of another component;
creating a compact version of the compound virtual appliance by packing together the partial versions of the plurality of components and a single copy of each virtual machine disk having been determined to be a duplicate;
deploying the compact version of the compound virtual appliance to a customer site; and
reconstructing, at the customer site, a complete version of the compound virtual appliance by adding back the single copy of each virtual machine disk having been determined to be a duplicate into each component having had the duplicate virtual machine disk removed.

2. The method of claim 1 further comprising:
mounting, at the customer site, a virtual machine disk included in the compound virtual appliance as a first folder, the first folder comprising a first virtual appliance, wherein the first virtual appliance comprises a first virtual machine disk specific to a first component of the application and does not comprise the duplicate virtual machine disk;
unpacking the first virtual appliance in the first folder;
adding the duplicate virtual machine disk to the first folder, the first folder thereby now comprising the duplicate virtual machine disk and the first virtual machine disk specific to the first component; and
packing the duplicate virtual machine disk and the first virtual machine disk specific to the first component together to create an intact version of the first component.

3. The method of claim 2 further comprising:
mounting, at the customer site, another virtual machine disk included in the compound virtual appliance as a second folder, the second folder comprising a second virtual appliance, wherein the second virtual appliance comprises a second virtual machine disk specific to a second component of the application and does not comprise the duplicate virtual machine disk;
unpacking the second virtual appliance in the second folder;
adding the duplicate virtual machine disk to the second folder, the second folder thereby now comprising the duplicate virtual machine disk and the second virtual machine disk specific to the second component; and
packing the duplicate virtual machine disk and the second virtual machine disk specific to the second component together to create an intact version of the second component.

4. The method of claim 1 wherein a first component of the application is to be deployed as a first virtual machine, and a second component of the application is to be deployed as a second virtual machine.

5. The method of claim 1 wherein the virtual appliance is formatted as an Open Virtual Appliance (OVA) file.

6. The method of claim 1 wherein the compact version of the compound virtual appliance comprises the duplicate virtual machine disk, a first virtual appliance, and a second virtual appliance, the first virtual appliance corresponding to a first component of the application, and the second virtual appliance corresponding to a second component of the application,
wherein the first virtual appliance is packaged as a virtual machine disk in the compound virtual appliance, and the second virtual appliance is packaged as another virtual machine disk in the compound virtual appliance, and
wherein the duplicate virtual machine disk is omitted from the first and second virtual appliances.

7. A system comprising: a processor; and memory configured to store one or more sequences of instructions which, when executed by the processor, cause the processor to carry out the steps of:
providing an application as a compound virtual appliance, the compound virtual appliance comprising a plurality of components for the application that will be hosted by a plurality of virtual machines, each component comprising a plurality of virtual machine disks;
creating partial versions of the plurality of components by removing from each component each virtual machine disk determined to be a duplicate of a virtual machine disk of another component;
creating a compact version of the compound virtual appliance by packing together the partial versions of the plurality of components and a single copy of each virtual machine disk having been determined to be a duplicate;
deploying the compact version of the compound virtual appliance to a customer site; and reconstructing, at the customer site, a complete version of the compound virtual appliance by adding back the single copy of each virtual machine disk having been determined to be a duplicate into each component having had the duplicate virtual machine disk removed.

8. The system of claim 7 wherein the processor further carries out the steps of:
mounting, at the customer site, a virtual machine disk included in the compound virtual appliance as a first folder, the first folder comprising a first virtual appliance, wherein the first virtual appliance comprises a first virtual machine disk specific to a first component of the application and does not comprise the duplicate virtual machine disk;
unpacking the first virtual appliance in the first folder;
adding the duplicate virtual machine disk to the first folder, the first folder thereby now comprising the duplicate virtual machine disk and the first virtual machine disk specific to the first component; and
packing the duplicate virtual machine disk and the first virtual machine disk specific to the first component together to create an intact version of the first component.

9. The system of claim 8 wherein the processor further carries out the steps of:
mounting, at the customer site, another virtual machine disk included in the compound virtual appliance as a second folder, the second folder comprising a second virtual appliance, wherein the second virtual appliance comprises a second virtual machine disk specific to a second component of the application and does not comprise the duplicate virtual machine disk;
unpacking the second virtual appliance in the second folder;
adding the duplicate virtual machine disk to the second folder, the second folder thereby now comprising the duplicate virtual machine disk and the second virtual machine disk specific to the second component; and
packing the duplicate virtual machine disk and the second virtual machine disk specific to the second component together to create an intact version of the second component.

10. The system of claim 7 wherein a first component of the application is to be deployed as a first virtual machine, and a second component of the application is to be deployed as a second virtual machine.

11. The system of claim 7 wherein the virtual appliance is formatted as an Open Virtual Appliance (OVA) file.

12. The system of claim 7 wherein the compact version of the compound virtual appliance comprises the duplicate virtual machine disk, a first virtual appliance, and a second virtual appliance, the first virtual appliance corresponding to a first component of the application, and the second virtual appliance corresponding to a second component of the application,
wherein the first virtual appliance is packaged as a virtual machine disk in the compound virtual appliance, and the second virtual appliance is packaged as another virtual machine disk in the compound virtual appliance, and
wherein the duplicate virtual machine disk is omitted from the first and second virtual appliances.

13. A computer program product, comprising a non-transitory computer-readable medium having a computer-readable program code embodied therein, the computer-readable program code adapted to be executed by one or more processors to implement a method comprising:
providing an application as a compound virtual appliance, the compound virtual appliance comprising a plurality of components for the application that will be hosted by a plurality of virtual machines, each component comprising a plurality of virtual machine disks;
creating partial versions of the plurality of components by removing from each component each virtual machine disk determined to be a duplicate of a virtual machine disk of another component;
creating a compact version of the compound virtual appliance by packing together the partial versions of the plurality of components and a single copy of each virtual machine disk having been determined to be a duplicate;
deploying the compact version of the compound virtual appliance to a customer site; and
reconstructing, at the customer site, a complete version of the compound virtual appliance by adding back the single copy of each virtual machine disk having been determined to be a duplicate into each component having had the duplicate virtual machine disk removed.

14. The computer program product of claim 13 wherein the method further comprises:
mounting, at the customer site, a virtual machine disk included in the compound virtual appliance as a first folder, the first folder comprising a first virtual appliance, wherein the first virtual appliance comprises a first virtual machine disk specific to a first component of the application and does not comprise the duplicate virtual machine disk;
unpacking the first virtual appliance in the first folder;
adding the duplicate virtual machine disk to the first folder, the first folder thereby now comprising the duplicate virtual machine disk and the first virtual machine disk specific to the first component; and
packing the duplicate virtual machine disk and the first virtual machine disk specific to the first component together to create an intact version of the first component.

15. The computer program product of claim 14 wherein the method further comprises:
mounting, at the customer site, another virtual machine disk included in the compound virtual appliance as a second folder, the second folder comprising a second virtual appliance, wherein the second virtual appliance comprises a second virtual machine disk specific to a second component of the application and does not comprise the duplicate virtual machine disk;
unpacking the second virtual appliance in the second folder;
adding the duplicate virtual machine disk to the second folder, the second folder thereby now comprising the duplicate virtual machine disk and the second virtual machine disk specific to the second component; and
packing the duplicate virtual machine disk and the second virtual machine disk specific to the second component together to create an intact version of the second component.

16. The computer program product of claim 13 wherein a first component of the application is to be deployed as a first virtual machine, and a second component of the application is to be deployed as a second virtual machine.

17. The computer program product of claim 13 wherein the virtual appliance is formatted as an Open Virtual Appliance (OVA) file.

18. The computer program product of claim 13 wherein the compact version of the compound virtual appliance comprises the duplicate virtual machine disk, a first virtual appliance, and a second virtual appliance, the first virtual appliance corresponding to a first component of the application, and the second virtual appliance corresponding to a second component of the application,
   wherein the first virtual appliance is packaged as a virtual machine disk in the compound virtual appliance, and the second virtual appliance is packaged as another virtual machine disk in the compound virtual appliance, and
   wherein the duplicate virtual machine disk is omitted from the first and second virtual appliances.

* * * * *